US010833266B2

United States Patent
Ando et al.

(10) Patent No.: US 10,833,266 B2
(45) Date of Patent: Nov. 10, 2020

(54) RESISTIVE MEMORY CROSSBAR ARRAY WITH RUTHENIUM PROTECTION LAYER

(71) Applicant: INTERNATIONAL BUSINESS MACHINES CORPORATION, Armonk, NY (US)

(72) Inventors: Takashi Ando, Tuckahoe, NY (US); Lawrence A. Clevenger, Saratoga Springs, NY (US); Michael Rizzolo, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 16/153,195

(22) Filed: Oct. 5, 2018

(65) Prior Publication Data
US 2020/0111958 A1  Apr. 9, 2020

(51) Int. Cl.
*H01L 45/00* (2006.01)
*H01L 27/24* (2006.01)

(52) U.S. Cl.
CPC ...... *H01L 45/1675* (2013.01); *H01L 27/2463* (2013.01); *H01L 45/1233* (2013.01); *H01L 45/1253* (2013.01)

(58) Field of Classification Search
CPC ..... H01L 45/1675; H01L 45/1233–124; H01L 45/1683
See application file for complete search history.

(56) References Cited

U.S. PATENT DOCUMENTS

| 7,829,923 | B2 | 11/2010 | Li et al. | |
|---|---|---|---|---|
| 8,169,053 | B2 | 5/2012 | Kim et al. | |
| 8,735,864 | B2 | 5/2014 | Tendulkar et al. | |
| 8,803,123 | B2 | 8/2014 | Nomachi | |
| 9,172,036 | B2 | 10/2015 | Chen et al. | |
| 9,245,925 | B1 | 1/2016 | Lee et al. | |
| 9,276,210 | B1 | 3/2016 | Tendulkar | |
| 9,425,391 | B1 | 8/2016 | Lai et al. | |
| 2005/0224855 | A1* | 10/2005 | Liu | H01L 21/76802 257/297 |
| 2009/0209050 | A1* | 8/2009 | Wang | H01L 43/12 438/3 |
| 2011/0089511 | A1* | 4/2011 | Keshtbod | B82Y 10/00 257/422 |
| 2015/0255718 | A1* | 9/2015 | Liu | H01L 45/122 257/4 |
| 2016/0204059 | A1 | 7/2016 | Fukuo et al. | |

(Continued)

OTHER PUBLICATIONS

Wong et al., "Metal-Oxide RRAM", Proceedings of the IEEE. vol. 100, No. 6. Jun. 2012. pp. 1951-1970.

*Primary Examiner* — Amar Movva
(74) *Attorney, Agent, or Firm* — Tutunjian & Bitetto, P.C.; Randall Bluestone

(57) ABSTRACT

A method is presented for protecting resistive random access memory (RRAM) stacks within a resistive memory crossbar array. The method includes forming a plurality of conductive lines within an interlayer dielectric (ILD), forming a RRAM stack including at least a hardmask having a first layer and a second layer, the second layer being a ruthenium layer, and removing the first layer of dual layer hardmask during a via opening such that the ruthenium layer remains intact to protect the RRAM stack during a damascene process.

16 Claims, 6 Drawing Sheets

(56) References Cited

U.S. PATENT DOCUMENTS

2016/0365512 A1* 12/2016 Sung .................. H01L 45/146
2017/0133585 A1   5/2017 Balakrishnan et al.
2018/0097177 A1   4/2018 Chang et al.

* cited by examiner

RESISTIVE MEMORY CROSSBAR ARRAY WITH RUTHENIUM PROTECTION LAYER

BACKGROUND

Technical Field

The present invention relates generally to semiconductor devices, and more specifically, to a resistive memory crossbar array compatible with a ruthenium protection layer.

Description of the Related Art

Resistive random access memory (RRAM) is considered a promising technology for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing the connection weight in the form of device resistance. Multiple pre-neurons and post-neurons can be connected through a crossbar array of RRAMs, which can express a fully-connected neural network configuration.

SUMMARY

In accordance with an embodiment, a method is provided for protecting resistive random access memory (RRAM) stacks within a resistive memory crossbar array. The method includes forming a plurality of conductive lines within an interlayer dielectric (ILD), forming a RRAM stack including at least a hardmask having a first layer and a second layer, the second layer being a ruthenium layer, and removing the first layer of dual layer hardmask during a via opening such that the ruthenium layer remains intact to protect the RRAM stack during a damascene process.

In accordance with another embodiment, a method is provided for protecting resistive random access memory (RRAM) stacks within a resistive memory crossbar array. The method includes forming a plurality of conductive lines within an interlayer dielectric (ILD), forming a RRAM stack having a bottom electrode, a top electrode, and a bi-layer hardmask including ruthenium, forming a low-k dielectric layer over the RRAM stack, removing a first layer of the bi-layer hardmask during a via opening, and removing a second layer of the bilayer hardmask concurrently with a plurality of sacrificial layers formed over the low-k dielectric layer to create a step-like via landing.

In accordance with yet another embodiment, a semiconductor device is provided for protecting resistive random access memory (RRAM) stacks within a resistive memory crossbar array. The semiconductor device includes a plurality of conductive lines disposed within an inter-layer dielectric (ILD), a barrier layer disposed in direct contact with a conductive line of the plurality of conductive lines, a bottom electrode disposed over the barrier layer, a high-k dielectric layer disposed over the bottom electrode, a top electrode disposed over the high-k dielectric layer, a ruthenium layer disposed in direct contact with the top electrode, and a conductive material disposed in direct contact with the ruthenium layer.

It should be noted that the exemplary embodiments are described with reference to different subject-matters. In particular, some embodiments are described with reference to method type claims whereas other embodiments have been described with reference to apparatus type claims.

However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing resistive random access memory (RRAM) devices. The RRAMs can be employed for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing a connection weight in the form of device resistance. Multiple pre-neurons and post-neurons can be connected through a crossbar array of RRAMs, which can be configured as a fully-connected neural network. Large scale integration of large RRAM arrays with complementary metal oxide semiconductor (CMOS) circuits can enable scaling of RRAM devices down to 10 nm and beyond for neuromorphic computing as well as high-density and high-speed non-volatile memory applications.

Embodiments in accordance with the present invention provide methods and devices for constructing a crossbar array structure including a bi-layer hardmask (including ruthenium) remaining on the RRAM at the alignment mark, a step-like metal via landing on the RRAM due to etch rate differences between the bi-layer hardmask and the spacers, and providing co-integration with a metal damascene process that enables the coexistence of high electrode conductivity and a small active area. The RRAM stack is protected by employing a ruthenium layer during the damascene process for upper copper lines. These methods and devices maintain the electrode cross section area as large as possible to maximize conductivity and makes the contact area small to miniaturize the active device area.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
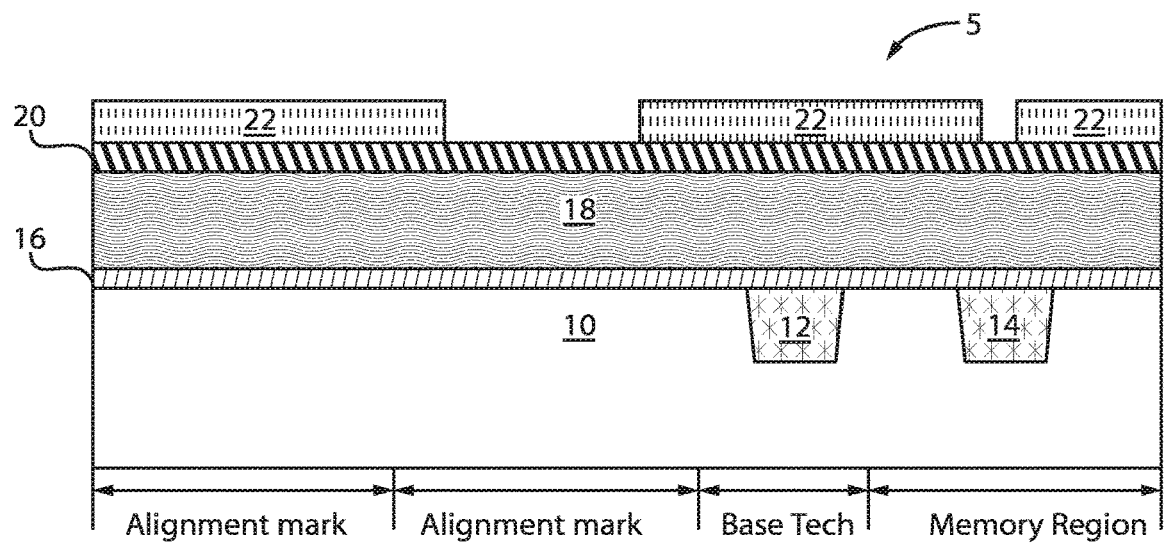
FIG. 1 is a cross-sectional view of a semiconductor structure including a plurality of conductive lines formed within a dielectric layer, where an organic planarization layer (OPL), an anti-reflective coating (ARC) layer, and a photoresist are deposited over the plurality of conductive lines, in accordance with an embodiment of the present invention.

FIG. 1 is a cross-sectional view of a semiconductor structure including a plurality of conductive lines formed within a dielectric layer, where an organic planarization layer (OPL), an anti-reflective coating (ARC) layer, and a photoresist are deposited over the plurality of conductive lines, in accordance with an embodiment of the present invention.

A semiconductor structure 5 includes a plurality of conductive lines 12, 14 formed within an inter-layer dielectric (ILD) 10. A dielectric cap layer 16 can be formed over the conductive lines 12, 14. An organic planarization layer (OPL) or organic dielectric layer (ODL) 18 can then be formed over the dielectric cap layer 16. Additionally, an anti-reflective coating (ARC) layer 20 and a photoresist layer 22 can be formed over portions of the OPL 18. Moreover, the structure 5 can be defined within, e.g., four regions. The first region can designate a first alignment mark, the second region can designate a second alignment mark, the third region can designate an electrical connection region, and the fourth region can designate a memory region. Alignment marks are used to align the wafer such that subsequent layers are formed at the correct location relative to underlying features. For example, alignment marks can be used to form the vias and conductive lines in the metallization layers in the correct location to make electrical contact to the devices, such as transistors, formed in the underlying substrate.

The ILD 10 can include any materials known in the art, such as, for example, porous silicates, carbon doped oxides, silicon dioxides, silicon nitrides, silicon oxynitrides, or other dielectric materials. The ILD 10 can be formed using any method known in the art, such as, for example, chemical vapor deposition, plasma enhanced chemical vapor deposition, atomic layer deposition, or physical vapor deposition. The ILD 10 can have a thickness ranging from about 25 nm to about 200 nm.

The dielectric material of layer 10 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The metal lines 12, 14 can be formed in the openings or trenches formed in the ILD 10. The metal lines 12, 14 can be any conductive materials known in the art, such as, for example, copper (Cu), aluminum (Al), or tungsten (W). The metal lines 12, 14 can be fabricated using any technique known in the art, such as, for example, a single or dual damascene technique. In an embodiment, not illustrated, the metal lines 12, 14 can be copper (Cu) and can include a metal liner, where a metal liner can be metals, such as, for example, tantalum nitride and tantalum (TaN/Ta), titanium, titanium nitride, cobalt, ruthenium, and manganese.

The dielectric cap 16 can be referred to as a barrier layer. The dielectric material of the dielectric cap 16 can be silicon nitride (SiN), etc.

The OPL layer 18 and the ARC layer 20 can be employed as a lithographic stack to pattern the underlying layers. The OPL layer 18 is formed at a predetermined thickness to provide reflectivity and topography control during etching of the hard mask layers below. The OPL layer 18 can include an organic material, such as a polymer. The thickness of the OPL 18 can be in a range from about 50 nm to about 300 nm. In one example, the thickness of the OPL 18 is about 135 nm.

The layer 20 is an ARC layer which minimizes the light reflection during lithography for a lithography stack. The ARC layer 20 can include silicon, for example, a silicon anti-reflective layer (SiARC). The thickness of the ARC layer 20 can be in range from about 10 nm to about 100 nm. The anti-reflective film layer 20 can be an antireflective layer for suppressing unintended light reflection during photolithography. Exemplary materials for an antireflective layer include, but are not limited to, metal silicon nitrides, or a polymer film. The anti-reflective layer can be formed, depending on materials, for example, using sputter deposition, chemical vapor deposition, or spin coating.

A photolithography process usually includes applying a layer of photoresist material 22 (e.g., a material that will react when exposed to light), and then selectively exposing portions of the photoresist 22 to light or other ionizing radiation (e.g., ultraviolet, electron beams, X-rays, etc.), thereby changing the solubility of portions of the material. The resist 22 is then developed by washing the resist with a developer solution, such as, e.g., tetramethylammonium hydroxide (TMAH), thereby removing non-irradiated (in a negative resist) or irradiated (in a positive resist) portions of the resist layer.

Figure 2:
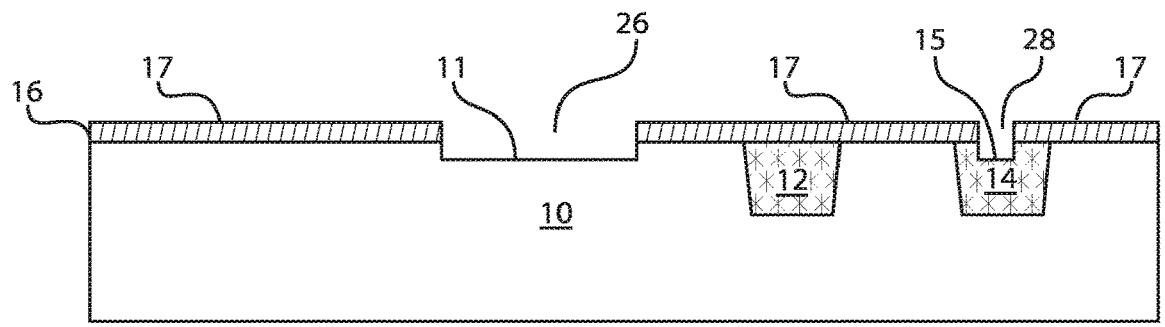
FIG. 2 is a cross-sectional view of the semiconductor structure of FIG. 1 where the photoresist is removed, and the OPL and ARC layer are etched to expose a top surface of one or more of the conductive lines, in accordance with an embodiment of the present invention.

FIG. 2 is a cross-sectional view of the semiconductor structure of FIG. 1 where the photoresist is removed, and the OPL and ARC layer are etched to expose a top surface of one or more of the conductive lines, in accordance with an embodiment of the present invention.

In various example embodiments, the OPL 18, the ARC layer 20, and the photoresist 22 are etched to form an opening or trench 26 to expose a top surface 11 of the ILD 10 and to form an opening or trench 28 to expose a top surface 15 of conductive line 14. Additionally, a top surface 17 of the dielectric cap 16 is exposed.

Figure 3:
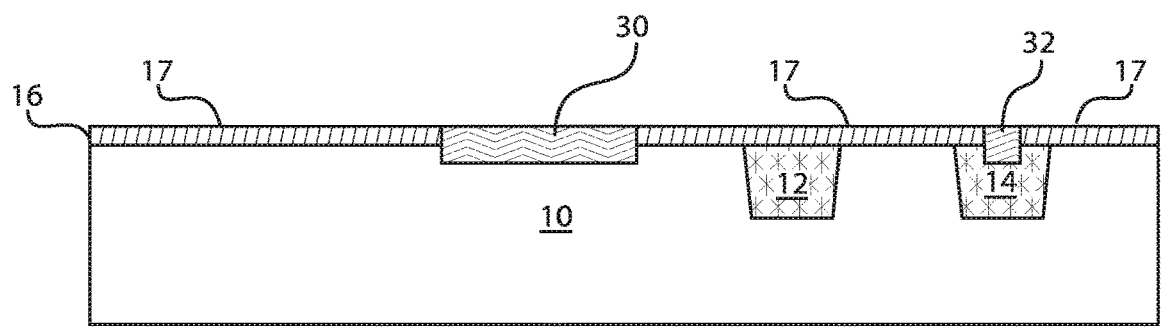
FIG. 3 is a cross-sectional view of the semiconductor structure of FIG. 2 where a metal nitride layer is deposited in recesses of the dielectric layer and reduced by chemical-mechanical polishing (CMP), in accordance with an embodiment of the present invention.

FIG. 3 is a cross-sectional view of the semiconductor structure of FIG. 2 where a metal nitride layer is deposited in recesses of the dielectric layer and reduced by chemical-mechanical polishing (CMP), in accordance with an embodiment of the present invention.

In various example embodiments, a metal nitride liner is deposited and then recessed by, e.g., CMP such that a first metal nitride layer 30 is formed in the trench 26 and a second metal nitride layer 32 is formed in the trench 28 and over the conductive line 14. The first and second metal nitride layers 30, 32 are planarized by, e.g., CMP, such that top surfaces of the first and second metal nitride layers 30, 32 are flush with a top surface 17 of the dielectric cap 16. In a preferred embodiment, the first and second metal nitride layers 30, 32 are tantalum nitride (TaN) layers. The metal nitride layers 30, 32 can be referred to as barrier layers.

Figure 4:
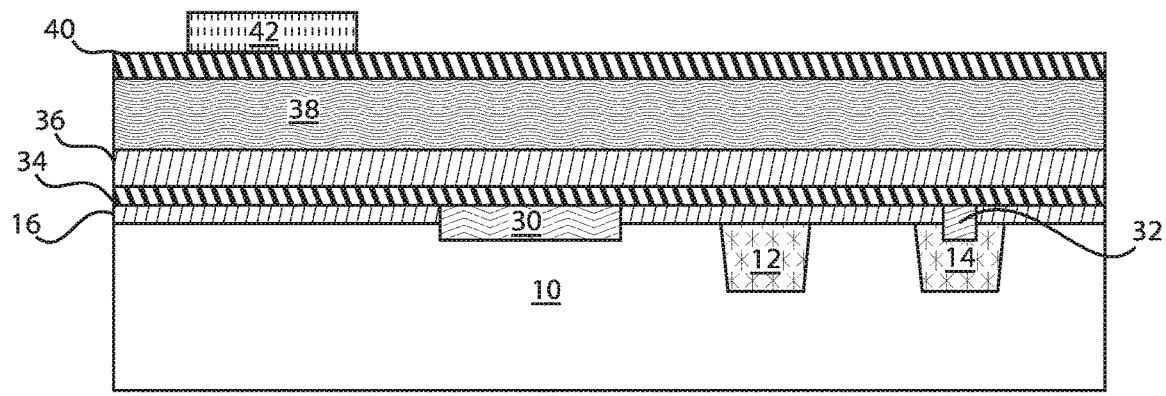
FIG. 4 is a cross-sectional view of the semiconductor structure of FIG. 3 where a bottom electrode, a hardmask, an organic planarization layer (OPL), an anti-reflective coating (ARC) layer, and a photoresist are deposited, in accordance with an embodiment of the present invention.

FIG. 4 is a cross-sectional view of the semiconductor structure of FIG. 3 where a bottom electrode, a hardmask, an organic planarization layer (OPL), an anti-reflective coating (ARC) layer, and a photoresist are deposited, in accordance with an embodiment of the present invention.

In various example embodiments, a bottom electrode 34 is deposited. The bottom electrode 34 is in direct contact with the first and second metal nitride layers 30, 32. Then a hardmask 36 is deposited over the bottom electrode 34.

The bottom electrode 34 can include a conductive material, such as Cu, Al, Ag, Au, Pt, W, etc. In some embodiments, the bottom electrode 34 can include nitrides such as TiN, TaN, Ta or Ru. In a preferred embodiment, the bottom electrode 34 is TiN.

In various embodiments, the hardmask layer 36 can be a nitride, for example, a silicon nitride (SiN), an oxynitride, for example, silicon oxynitride (SiON), or a combination thereof. In a preferred embodiment, the hardmask layer 36 can be silicon nitride (SiN), for example, $Si_3N_4$.

In one or more embodiments, the hardmask layer 36 can have a thickness in the range of about 20 nm to about 100 nm, or in the range of about 35 nm to about 75 nm, or in the range of about 45 nm to about 55 nm, although other thicknesses are contemplated.

Subsequently, an organic planarization layer (OPL) or organic dielectric layer (ODL) 38 can then be formed over the hardmask layer 36. Additionally, an anti-reflective coating (ARC) layer 40 and a photoresist layer 42 can be formed over portions of the OPL 38. The thickness of the OPL 38 can be in a range from about 50 nm to about 300 nm. In one example, the thickness of the OPL 38 is about 100 nm.

Figure 5:
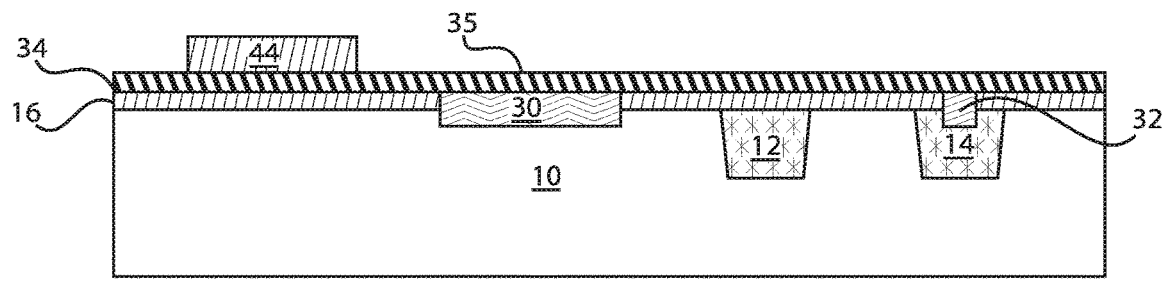
FIG. 5 is a cross-sectional view of the semiconductor structure of FIG. 4 where the OPL, the ARC layer, and the photoresist are etched such that a portion of the hardmask remains over the bottom electrode, in accordance with an embodiment of the present invention.

FIG. 5 is a cross-sectional view of the semiconductor structure of FIG. 4 where the OPL, the ARC layer, and the photoresist are etched such that a portion of the hardmask remains over the bottom electrode, in accordance with an embodiment of the present invention.

In various embodiments, the OPL 38, the ARC layer 40, and the photoresist 42 are etched to form a hardmask portion 44 over the bottom electrode 34. Additionally, a top surface 35 of the bottom electrode 34 is exposed. The hardmask portion 44 is offset from the conductive lines 12, 14. The hardmask portion 44 is offset from the first and second metal nitride layers 30, 32.

Figure 6:
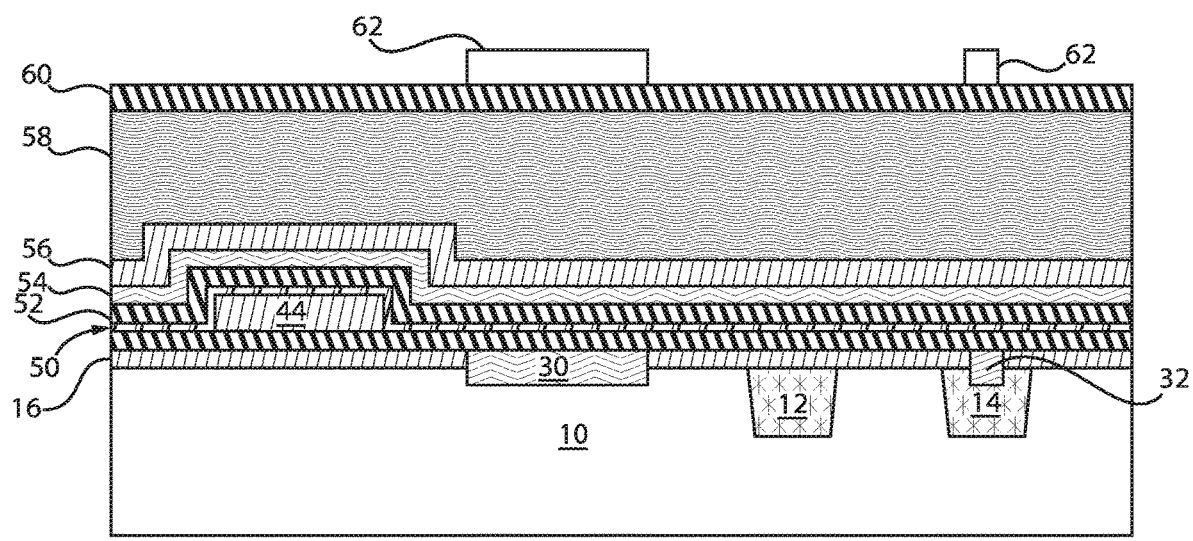
FIG. 6 is a cross-sectional view of the semiconductor structure of FIG. 5 where a resistive random access memory (RRAM) stack is formed, and then another lithography stack is deposited over the RRAM stack, in accordance with an embodiment of the present invention.

FIG. 6 is a cross-sectional view of the semiconductor structure of FIG. 5 where a resistive random access memory (RRAM) stack is formed, and then another lithography stack is deposited over the RRAM stack, in accordance with an embodiment of the present invention.

In various embodiments, a RRAM stack is formed. The RRAM stacks includes a first layer 50, a second layer 52, a third layer 54, and a fourth layer 56. The first layer 50 can be, e.g., a hafnium oxide (HfO) layer, the second layer 52 can be, e.g., a TiN layer, the third layer 54 can be, e.g., ruthenium (Ru) layer, and the fourth layer 56 can be another hardmask layer, such as a SiN layer. The first layer 50 can be any type of high-k dielectric layer, such as, but not limited to, $HfO_2$, HfSiO, HfSiON, HfZrO, $Ta_2O_5$, $TiO_2$, $ZrO_2$, $La_2O_3$, $Y_2O_3$, $Al_2O_3$, and mixtures thereof. The second layer 52 can be referred to as a metal layer formed of a thermally stable metal, such as TiN, TaN, TaC, TiAlN, TaAlN, or their derivatives. The third and fourth layers 54, 56 can be referred to collectively as a bi-layer hardmask (Ru/SiN) that remains on the RRAM at the alignment mark.

In various embodiments, a lithographic stack can be formed over the RRAM stack. The lithographic stack can include an organic planarization layer (OPL) or organic dielectric layer (ODL) 58 can then be formed over the hardmask layer 56 of the RRAM stack. Additionally, an anti-reflective coating (ARC) layer 60 and a photoresist layer 62 can be formed over portions of the OPL 58. The thickness of the OPL 58 can be in a range from about 50 nm to about 300 nm. In one example, the thickness of the OPL 58 is about 200 nm.

Figure 7:
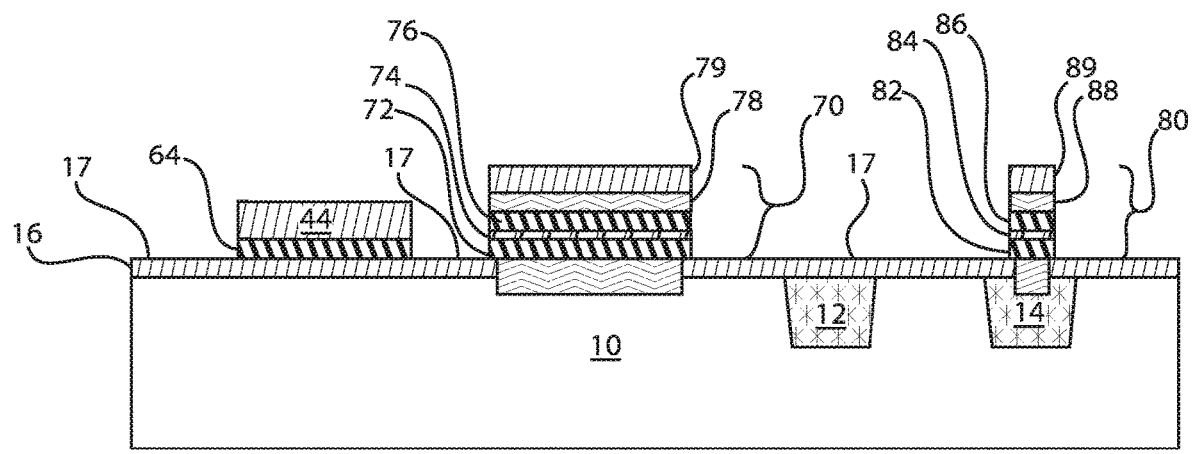
FIG. 7 is a cross-sectional view of the semiconductor structure of FIG. 6 where the RRAM stack is etched thus forming a first RRAM stack over the metal nitride layer and a second RRAM stack formed over at least one conductive line, in accordance with an embodiment of the present invention.

FIG. 7 is a cross-sectional view of the semiconductor structure of FIG. 6 where the RRAM stack is etched thus forming a first RRAM stack over the metal nitride layer and a second RRAM stack formed over at least one conductive line, in accordance with an embodiment of the present invention.

In various embodiments, the OPL 58, the ARC layer 60, and the photoresist 62 are etched to form a first RRAM stack 70 and a second RRAM stack 80. The etching can be, e.g., a reactive ion etch (RIE). Additionally, a top surface 17 of the dielectric cap 16 is exposed. The hardmask portion 44 remains over a portion 64 the bottom electrode 34.

The first RRAM stack 70 includes 5 layers. The first layer 72 can be a TiN layer, the second layer 74 can be a HfO layer, the third layer 76 can be a TiN layer, the fourth layer 78 can be a ruthenium (Ru) layer, and the fifth layer 79 can be a SiN layer. The first layer 72 can be referred to as the bottom electrode and the third layer 76 can be referred to as the top electrode. The first RRAM stack 70 is formed over the first metal nitride layer 30. The fourth and fifth layers 78, 79 can be referred to collectively as a bi-layer hardmask including Ru.

Similarly, the second RRAM stack 80 includes 5 layers. The first layer 82 can be a TiN layer, the second layer 84 can be a HfO layer, the third layer 86 can be a TiN layer, the fourth layer 88 can be a ruthenium (Ru) layer, and the fifth layer 89 can be a SiN layer. The first layer 82 can be referred to as the bottom electrode and the third layer 86 can be referred to as the top electrode. The second RRAM stack is formed over the second metal nitride layer 32 and over the conductive line 14. The fourth and fifth layers 88, 89 can be referred to collectively as a bi-layer hardmask including Ru.

Therefore, the RRAM stack 80 is built on top of metal line 14, the RRAM bottom electrode can be, e.g., TiN, TaN, or W, the RRAM metal oxide can be, e.g., HfOx, TaOx, TiOx, AlOx, the RRAM top electrode can be, e.g., Ti, TiN, and combination thereof, and the bilayer hardmask can be a ruthenium (Ru) layer/SiN hardmask for the RRAM stack.

Regarding the ruthenium employed in FIGS. 6 and 7, ruthenium is a transition metal, which means that ruthenium has an incomplete inner shell that serves as a link between the least and the most electropositive in a series of elements. Like the other members of the platinum family (platinum, rhodium, palladium, iridium, osmium), ruthenium is inert, which means Ru will not react when exposed to most chemicals. Ruthenium is extremely hard. It is often used as a hardener for platinum and palladium. Ruthenium also will not tarnish at room temperature, and small amounts of the material can enhance the corrosion resistance of titanium. Ruthenium's hardness makes it an excellent choice for increasing the wear resistance of electrical contacts and resistors, especially when alloyed with other platinum group metals. Ruthenium plating is also used when manufacturing semiconductors.

Ruthenium has drawn substantial interest because Ru can serve as both barrier and seed layers, minimizing the amount of high resistance material needed in semiconductor circuits. As linewidths shrink below 15 nm, though, even a 1 or 2 nanometer barrier layer may be too much. As line volume shrinks, the resistance of copper (Cu) rises sharply due to electron scattering from sidewalls and grain boundaries. Increasing resistance adds to overall circuit delays and also contributes to electromigration. As a refractory metal, ruthenium has a very high melting point (above 2300° C.) and good electromigration resistance. Therefore, the use of ruthenium provides advantageous unexpected results, as the stripping of the TiN layer does not affect (e.g., etch) the ruthenium layer during processing. Additionally, the ruthenium layer acts a top electrode contact that has a conductive oxide to protect the TiN layer below. Thus, ruthenium has the advantageous unexpected result that it remains in place as a conductive top contact during TiN hardmask removal.

Figure 8:
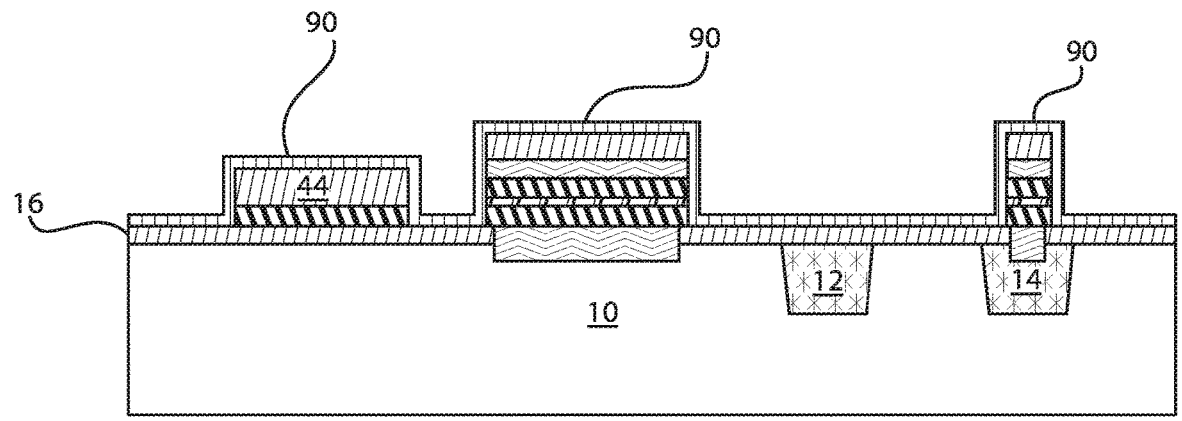
FIG. 8 is a cross-sectional view of the semiconductor structure of FIG. 7 where the first and second RRAM stacks are encapsulated by a dielectric material, in accordance with an embodiment of the present invention.

FIG. 8 is a cross-sectional view of the semiconductor structure of FIG. 7 where the first and second RRAM stacks are encapsulated by a dielectric material, in accordance with an embodiment of the present invention.

In various embodiments, a SiN encapsulation 90 takes place. The SiN layer 90 encapsulates both the first and second RRAM stacks 70, 80.

Figure 9:
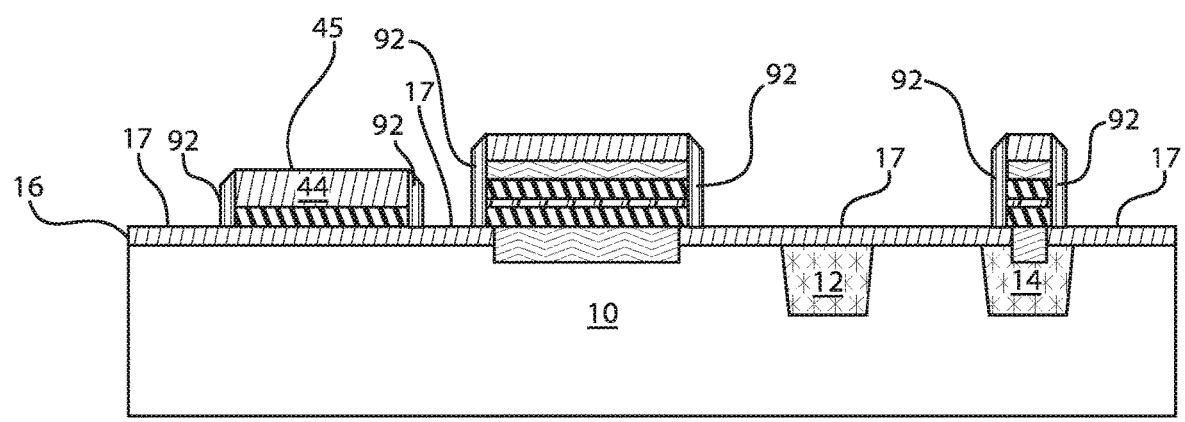
FIG. 9 is a cross-sectional view of the semiconductor structure of FIG. 8 where the dielectric material is etched to form outer spacers adjacent at least the first and second RRAM stacks, in accordance with an embodiment of the present invention.

FIG. 9 is a cross-sectional view of the semiconductor structure of FIG. 8 where the dielectric material is etched to form outer spacers adjacent at least the first and second RRAM stacks, in accordance with an embodiment of the present invention.

In various embodiments, the SiN layer 90 is etched to form outer spacers 92 adjacent the first RRAM stack 70 and the second RRAM stack 80. The SiN layer 90 can be selectively etched by, e.g., RIE. The etch also results in the exposure of the top surfaces of the hardmask 79, 89 of the first and second RRAM stacks 70, 80, respectively. Additionally, the etch results in the exposure of the top surface 45 of the hardmask portion 44.

Figure 10:
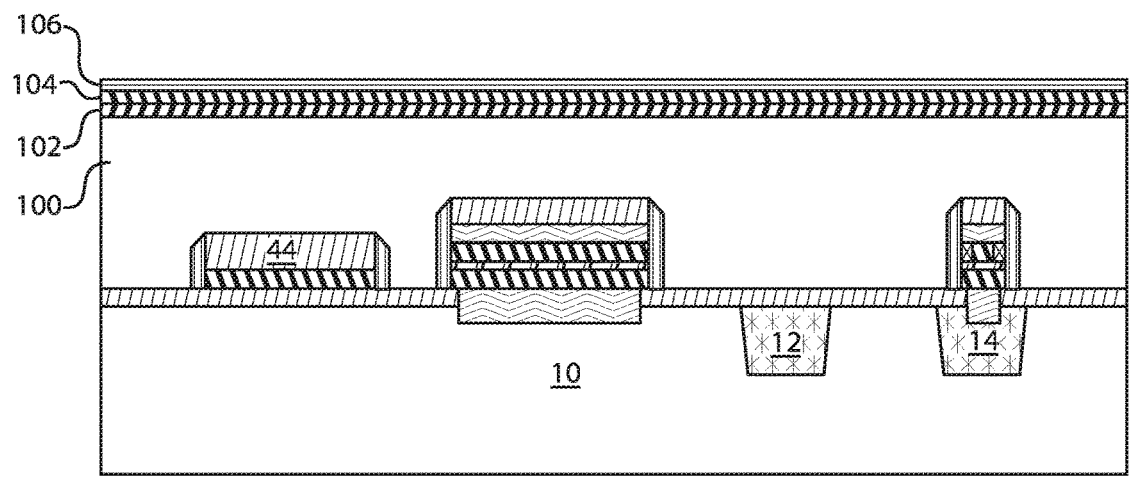
FIG. 10 is a cross-sectional view of the semiconductor structure of FIG. 9 where an interlayer dielectric (ILD) and a plurality of sacrificial layers are deposited, in accordance with an embodiment of the present invention.

FIG. 10 is a cross-sectional view of the semiconductor structure of FIG. 9 where an interlayer dielectric (ILD) and a plurality of sacrificial layers are deposited, in accordance with an embodiment of the present invention.

In various embodiments, a low-k dielectric layer 100 is deposited. A low-k dielectric material as used in the low-k dielectric layer 100 can have a dielectric constant that is less than 4.0, e.g., 3.9. In one embodiment, the low-k material layer 100 can have a dielectric constant ranging from about 1.0 to about 3.5. In another embodiment, the low-k material layer 100 can have a dielectric constant ranging from about 1.75 to about 3.2.

One example of a material suitable for the low-k materials for the low-k dielectric layer 100 can include silicon oxycarbonitride (SiOCN). Other low-k materials that can also be used for the low-k dielectric layer 100 can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer 100 can be conformally deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed. In some embodiments, the low-k dielectric layer 100 can have a thickness ranging from about 5 nm to about 30 nm. In another embodiment, the low-k dielectric layer 100 can have a thickness ranging from about 7 nm to about 15 nm.

Subsequently, a plurality of sacrificial layers can be deposited. In one example, a first sacrificial layer 102, a second sacrificial layer 104, and a third sacrificial layer 106 are deposited over the low-k dielectric layer 100. In one example, the first sacrificial layer 102 can be a SiN layer, the second sacrificial layer 104 can be a TiN hardmask, and the third sacrificial layer 106 can be a TEOS hard mask (tetra-ethyl orthosilicate, $Si(OC_2H_5)_4$).

Figure 11:
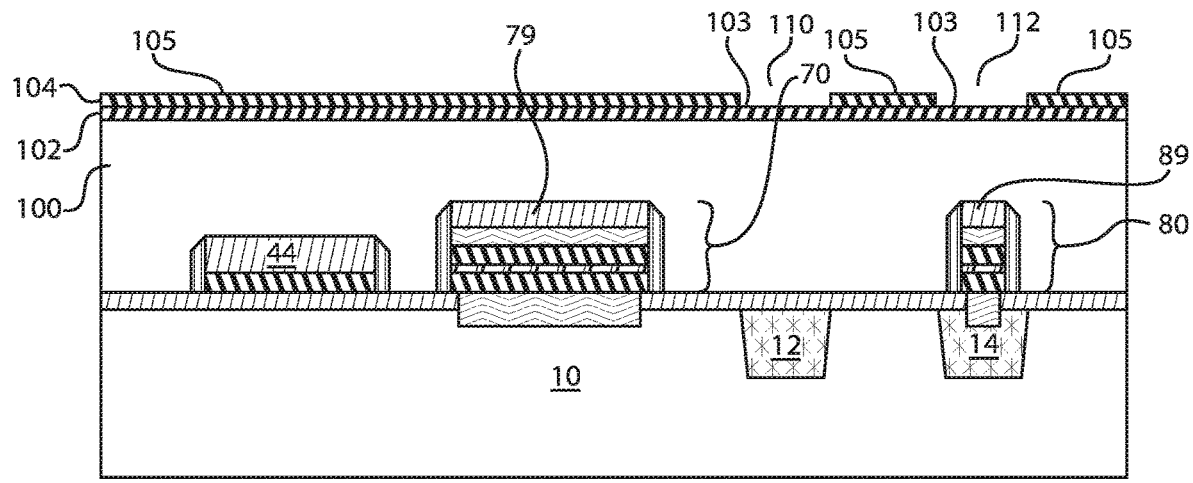
FIG. 11 is a cross-sectional view of the semiconductor structure of FIG. 10 where the sacrificial layers are etched to form openings directly over the plurality of conductive lines, in accordance with an embodiment of the present invention.

FIG. 11 is a cross-sectional view of the semiconductor structure of FIG. 10 where the sacrificial layers are etched to form openings directly over the plurality of conductive lines, in accordance with an embodiment of the present invention.

In various embodiments, the second and third sacrificial layers 104, 106 can be etched by, e.g., RIE, to create a first opening or recess 110 over the conductive line 12 and to create a second opening or recess 112 over the conductive line 14. The first sacrificial layer 102 is not removed. The top surface 103 of the first sacrificial layer 102 remains intact in the first and second openings 110, 112. The third sacrificial layer 106 is completely removed such that a top surface 105 of the second sacrificial layer 104 is exposed in areas where the openings 110, 112 do not occur.

Figure 12:
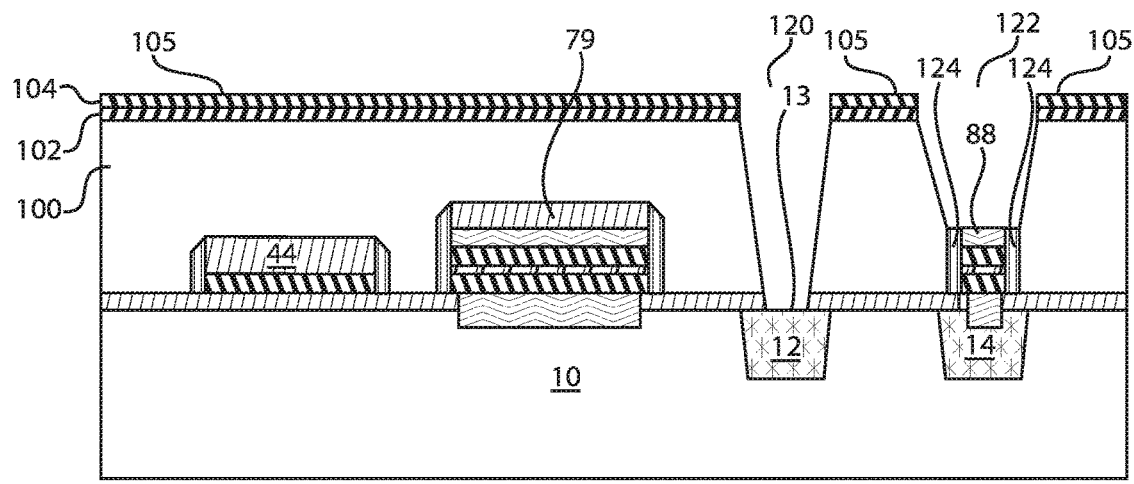
FIG. 12 is a cross-sectional view of the semiconductor structure of FIG. 11 where the ruthenium layer of the RRAM stack formed over the conductive line is exposed, in accordance with an embodiment of the present invention.

FIG. 12 is a cross-sectional view of the semiconductor structure of FIG. 11 where the RRAM stack formed over the conductive line is exposed, in accordance with an embodiment of the present invention.

In various embodiments, vias are formed. A first via 120 extends to a top surface 13 of the conductive line 12 and a second via 122 extends to a top surface of the ruthenium layer 88. Additionally, remaining spacers 124 are maintained. The top surface of the ruthenium layer 88 is thus exposed. A top surface of the spacers 124 is also exposed. The via opening results in the first hardmask layer 89 of the bi-layer or dual layer hardmask being selectively removed.

Figure 13:
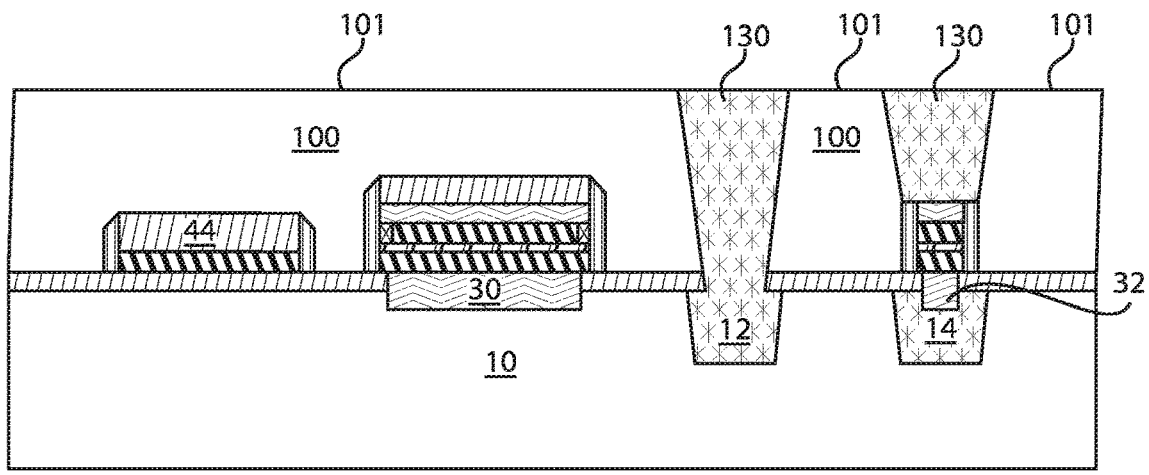
FIG. 13 is a cross-sectional view of the semiconductor structure of FIG. 12 where the sacrificial layers are removed and a metal fill takes place, the metal fill being planarized, in accordance with an embodiment of the present invention.

FIG. 13 is a cross-sectional view of the semiconductor structure of FIG. 13 where the sacrificial layers are removed and a metal fill takes place, the metal fill being planarized, in accordance with an embodiment of the present invention.

In various embodiments, the first and second sacrificial layers 102, 104 are completely removed to expose a top surface 101 of the low-k dielectric layer 100. The structure in the second via 122 protects the RRAM stack 80 from wet processes.

Therefore, the Ru layer 88 protects the RRAM stack during TiN hardmask removal (e.g., sacrificial layer 104). The remaining structure is the bottom electrode 82, the dielectric layer 84, and the top electrode 86, as well as the outer spacers 124. The Ru top contact 88 has conductive oxide that protects the TiN layer 86. In other words, the Ru layer 88 protects the RRAM stack 80 during TiN HM removal (e.g., SC1) and remains in place as the conductive top contact.

In various example embodiments, a conductive material 130 can be deposited. The metallization can be a single damascene metallization. Thus, only single damascene metallization is needed for the trench, thus enabling dynamic reflow or other fill techniques that are sensitive to pattern and profile needs. The conductive material 130 can be, for example, a metal or doped polysilicon (poly-Si). Non-limiting examples of metals include copper (Cu), cobalt (Co), aluminum (Al), platinum (Pt), gold (Au), tungsten (W), titanium (Ti), or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In exemplary embodiments, the height of the conductive material 130 can be reduced by chemical-mechanical polishing (CMP) and/or etching. Therefore, the planarization process can be provided by CMP. Other planarization process can include grinding and polishing.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega-m)^{-1}$.

Figure 14:
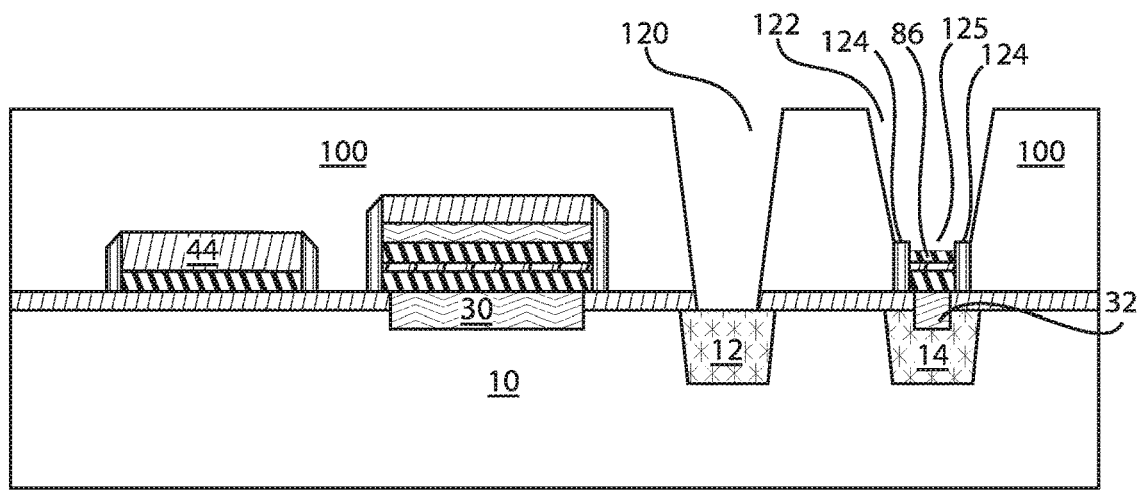
FIG. 14 is a cross-sectional view of a semiconductor structure where the RRAM stack formed over the conductive line is exposed and the ruthenium layer is removed by the formation of the via, in accordance with another embodiment of the present invention.

FIG. 14 is a cross-sectional view of a semiconductor structure where the RRAM stack formed over the conductive line is exposed and the ruthenium layer is removed by the formation of the via, in accordance with another embodiment of the present invention.

In various embodiments, vias are formed. A first via 120 extends to a top surface 13 of the conductive line 12 and a second via 122 extends to a top surface of the TiN layer 86. Thus, the ruthenium layer 88 is completely removed. Additionally, remaining spacers 124 are maintained. The top surface of the TiN layer 86 is thus exposed.

In this exemplary embodiment, the Ru layer 88 is removed to form a gap or trench 125 over the top electrode 86. This further exposes inner sidewalls of the outer spacers 124. Therefore, the Ru layer 88 protects the RRAM stack during TiN hardmask removal (e.g., sacrificial layer 104). The remaining structure is the bottom electrode 82, the dielectric layer 84, and the top electrode 86, as well as the outer spacers 124. The removal of the Ru layer 88 results in a step-like metal via landing on the RRAM due to the etch rate difference between the Ru layer 88 and the outer spacers 124.

As a result, the first layer 89 of the bi-layer hardmask is selectively removed during a via opening (FIG. 12) and the second layer 88 of the bilayer hardmask is selectively removed concurrently with sacrificial layers 102, 104 formed over the low-k dielectric layer 100. In one example, the second layer 88 of the bi-layer hardmask is kept to protect the RRAM stack 80 during the removal of the second sacrificial layer 104 in a Cu damascene integration.

Figure 15:
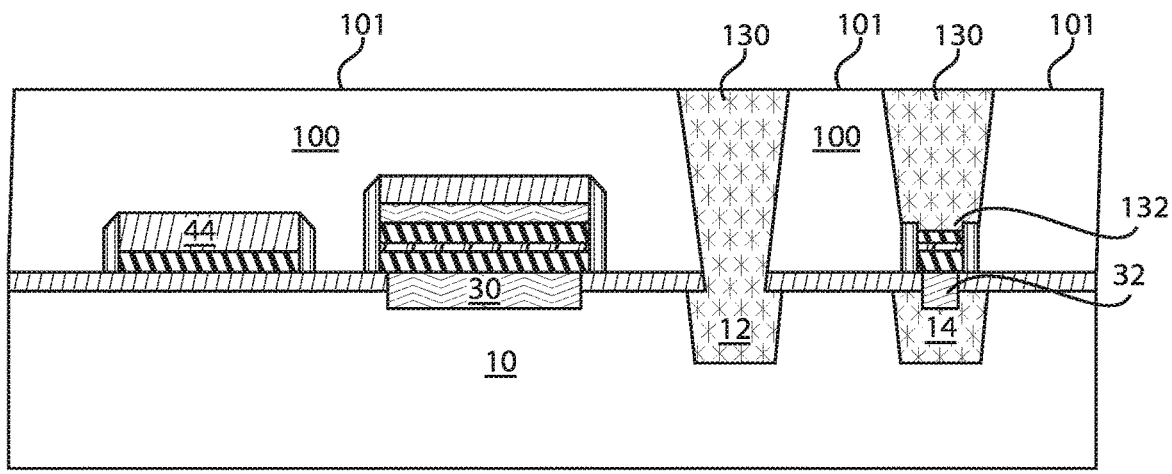
FIG. 15 is a cross-sectional view of the semiconductor structure of FIG. 14 where the sacrificial layers are removed and a metal fill takes place, the metal fill being planarized, in accordance with an embodiment of the present invention.

FIG. 15 is a cross-sectional view of the semiconductor structure of FIG. 14 where the sacrificial layers are removed and a metal fill takes place, the metal fill being planarized, in accordance with an embodiment of the present invention.

In various example embodiments, a conductive material 130 can be deposited. The metallization can be a single damascene metallization. The conductive material 130 can be, for example, a metal or doped polysilicon (poly-Si). Non-limiting examples of metals include copper (Cu), cobalt (Co), aluminum (Al), platinum (Pt), gold (Au), tungsten (W), titanium (Ti), or any combination thereof.

Figure 16:
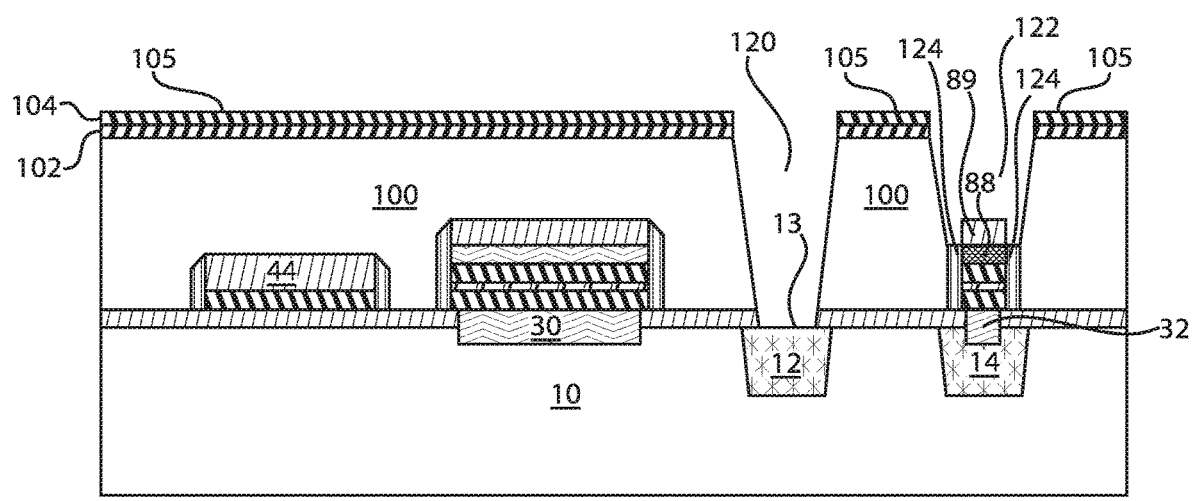
FIG. 16 is a cross-sectional view of a semiconductor structure where the RRAM stack formed over the conductive line is exposed and the TiN layer disposed over the ruthenium layer is present after the formation of the via, in accordance with another embodiment of the present invention.

FIG. 16 is a cross-sectional view of a semiconductor structure where the RRAM stack formed over the conductive line is exposed and the TiN layer disposed over the ruthenium layer is present after the formation of the via, in accordance with another embodiment of the present invention.

In various embodiments, vias are formed. A first via 120 extends to a top surface 13 of the conductive line 12 and a second via 122 extends to a top surface of the TiN layer 89. Thus, all five layers of the RRAM stack 80 remain intact. Additionally, remaining spacers 124 are maintained.

Figure 17:
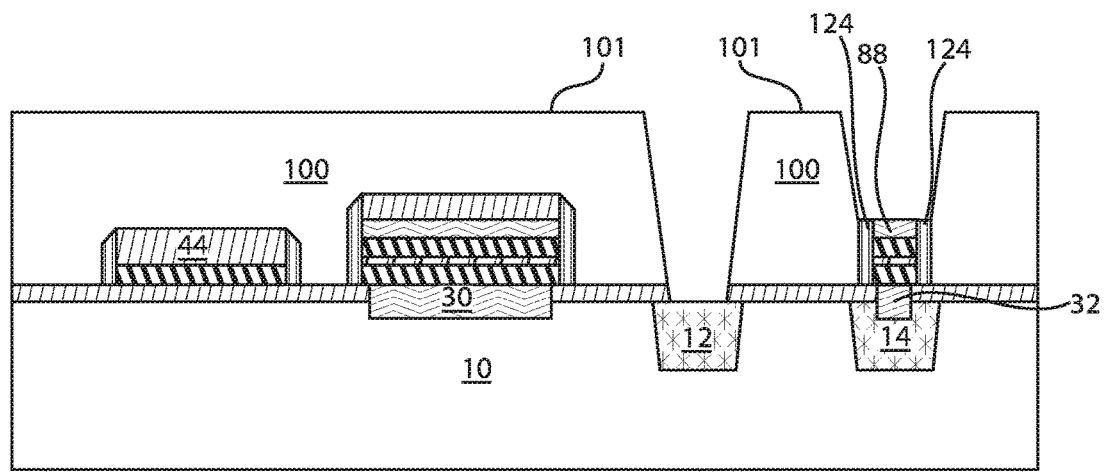
FIG. 17 is a cross-sectional view of a semiconductor structure of FIG. 16 where the TiN layer is removed to expose the ruthenium layer, in accordance with an embodiment of the present invention.

FIG. 17 is a cross-sectional view of a semiconductor structure of FIG. 16 where the TiN layer is removed to expose the ruthenium layer, in accordance with an embodiment of the present invention.

In various embodiments, the first and second sacrificial layers 102, 104 are completely removed to expose a top surface 101 of the low-k dielectric layer 100. Additionally, the TiN layer 89 is stripped from the RRAM stack 80. Thus, the ruthenium (Ru) layer 88 is exposed.

Figure 18:
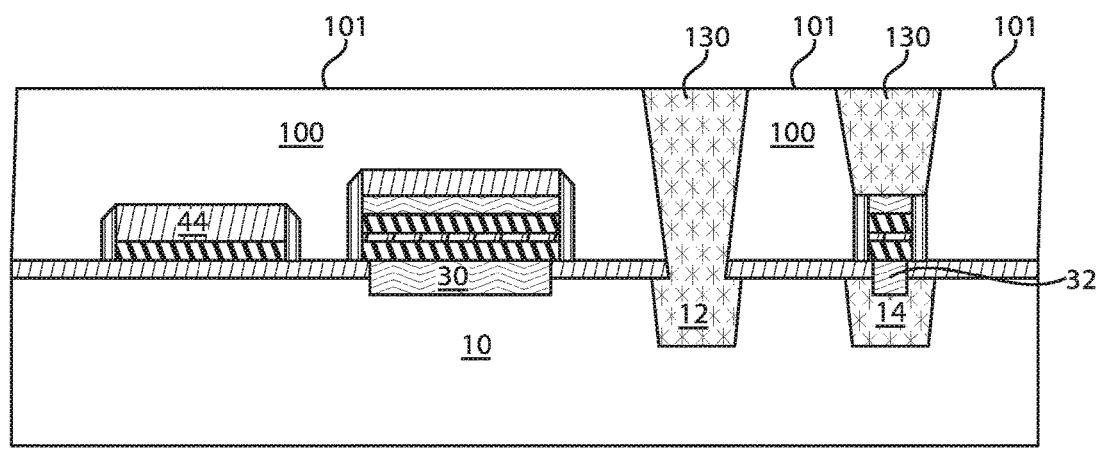
FIG. 18 is a cross-sectional view of the semiconductor structure of FIG. 17 where the sacrificial layers are removed and a metal fill takes place, the metal fill being planarized, in accordance with an embodiment of the present invention.

FIG. 18 is a cross-sectional view of the semiconductor structure of FIG. 17 where the sacrificial layers are removed and a metal fill takes place, the metal fill being planarized, in accordance with an embodiment of the present invention.

In various example embodiments, a conductive material 130 can be deposited. The metallization can be a single damascene metallization. The conductive material 130 can be, for example, a metal or doped polysilicon (poly-Si). Non-limiting examples of metals include copper (Cu), cobalt (Co), aluminum (Al), platinum (Pt), gold (Au), tungsten (W), titanium (Ti), or any combination thereof.

In conclusion, the exemplary embodiments of the present invention employ RRAM stacks built between conductive lines (e.g., Cu lines), where the RRAM bottom electrode can be, e.g., TiN, TaN, or W, the RRAM metal oxide can be, e.g., HfOx, TaOx, TiOx, AlOx, and the RRAM top electrode can be, e.g., Ti, TiN, and combination thereof. A protection metal layer can then be formed on top of the RRAM stack. A TiN wet etching (e.g. SCl, $H_2O_2$) has high selectivity to the protection metal layer. The protection metal layer can be etchable with high selectivity to the RRAM top electrode. The top electrode can be ruthenium. In another embodiment, optionally, etch stop metal (e.g. TiN) can be formed on top of the protection metal layer. Then, a Cu via opening can stop on the Ru (or the etch stop metal). The TiN hardmask for Cu damascene can be removed by wet etching while the RRAM stack is protected. Moreover, optionally, the protection metal layer can be removed selectively to the RRAM top electrode followed by liner and Cu fill for the upper lines. The RRAM stack is fully protected during the Cu damascene integration and there is no impact on switching characteristics due to capability of selective removal of the protection metal layer to the RRAM stack. The protection metal layer is present in the alignment mark region of the final structure and is detectable. Consequently, in the first RRAM stack there is a bi-layer hardmask (Ru/SiN) remaining on the RRAM alignment mark and there is a step-like Cu via landing on the second RRAM stack due to the removal of the Ru layer. As a result, the RRAM stacks can be protected by employing Ru hardmask during the damascene process for upper Cu lines. The Ru layer covers the entire top electrode.

Stated differently, the exemplary embodiments of the present invention employ a protection metal layer on RRAM stacks. The protection layer is maintained to protect the RRAM stack during the TiN hard mask removal in a Cu damascene integration. Then the protection layer is optionally removed selectively to the RRAM stack. Ru is a preferred choice of material meeting these requirements. The final structure includes via contacts on the RRAM stacks in a self-aligned manner and the Ru protection layer remains in the RRAM stacks in the alignment area of the chip.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for employing a resistive memory crossbar array compatible with a ruthenium protection layer (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for protecting resistive random access memory (RRAM) stacks within a resistive memory crossbar array, the method comprising:
    forming a plurality of conductive lines within an inter-layer dielectric (ILD);
    constructing a dielectric cap layer directly contacting the plurality of conductive lines;
    forming a RRAM stack including at least a hardmask having a first layer and a second layer, the second layer being a ruthenium layer;
    forming spacers adjacent the RRAM stack, the spacers being separate and distinct from the dielectric cap layer; and
    removing the first layer of dual layer hardmask during a via opening such that the ruthenium layer remains intact to protect the RRAM stack during a damascene process.

2. The method of claim 1, further comprising forming a metal nitride layer in direct contact with and extending into a conductive line of the plurality of conductive lines.

3. The method of claim 2, wherein the RRAM stack further includes a top electrode and a bottom electrode, the bottom electrode in direct contact with the metal nitride layer.

4. The method of claim 3, further comprising forming an encapsulation layer over the RRAM stack.

5. The method of claim 4, further comprising etching the encapsulation layer to form spacers adjacent the RRAM stack.

6. The method of claim 5, further comprising selectively recessing a plurality of sacrificial layers formed over a low-k dielectric layer to create an opening in alignment with the RRAM stack.

7. The method of claim 6, wherein the plurality of sacrificial layers includes a first sacrificial layer, a second sacrificial layer, and a third sacrificial layer.

8. The method of claim 7, further comprising filling the via opening with a conductive material.

9. A method for protecting resistive random access memory (RRAM) stacks within a resistive memory crossbar array, the method comprising:
    forming a plurality of conductive lines within an inter-layer dielectric (ILD);
    forming a RRAM stack having a bottom electrode, a top electrode, and a bi-layer hardmask including ruthenium;
    forming a low-k dielectric layer over the RRAM stack;
    removing a first layer of the bi-layer hardmask during a via opening; and
    removing a second layer of the bilayer hardmask concurrently with a plurality of sacrificial layers formed over the low-k dielectric layer to create a step-like via landing.

10. The method of claim 9, further comprising forming a barrier layer over a conductive line of the plurality of conductive lines in alignment with the RRAM stack.

11. The method of claim 10, further comprising forming an encapsulation layer over the RRAM stack.

12. The method of claim 11, further comprising etching the encapsulation layer to form outer spacers adjacent the RRAM stack.

13. The method of claim 12, further comprising selectively recessing the plurality of sacrificial layers to create an opening in alignment with the RRAM stack.

14. The method of claim 13, wherein the plurality of sacrificial layers includes a first sacrificial layer, a second sacrificial layer, and a third sacrificial layer.

15. The method of claim 14, further comprising filling the via opening with a conductive material.

16. The method of claim 15, wherein etch rate differences between the bi-layer hardmask and the outer spacers creates the step-like via landing on the RRAM.

\* \* \* \* \*